（12）United States Patent
Ramoutar et al.

(10) Patent No.: US 11,641,178 B2
(45) Date of Patent: May 2, 2023

(54) OSCILLATOR CIRCUIT

(71) Applicant: Carrier Corporation, Palm Beach Gardens, FL (US)

(72) Inventors: Michael Ramoutar, Westford, MA (US); Marat Patotski, Gdańsk (PL); Lukasz Sulkowski, Gdańsk (PL); Sebastian Mansfeld, Gdańsk (PL)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 17/559,184

(22) Filed: Dec. 22, 2021

(65) Prior Publication Data

US 2022/0200530 A1    Jun. 23, 2022

(30) Foreign Application Priority Data

Dec. 23, 2020 (EP) .................................... 20217027

(51) Int. Cl.
*H03B 5/18* (2006.01)
*H03B 5/12* (2006.01)

(52) U.S. Cl.
CPC ......... *H03B 5/1231* (2013.01); *H03B 5/1847* (2013.01); *H03B 2200/0028* (2013.01); *H03B 2200/0062* (2013.01); *H03B 2201/02* (2013.01)

(58) Field of Classification Search
CPC ...... H03B 5/1203; H03B 5/1231; H03B 5/18; H03B 5/1817; H03B 5/1823;
(Continued)

(56) References Cited

U.S. PATENT DOCUMENTS 3,878,481 A * 4/1975 Healey, III ............... H03B 5/36
  331/116 R
4,091,339 A   5/1978 Sugimoto et al.
(Continued)

FOREIGN PATENT DOCUMENTS

CN    203522644 U    4/2014
CN    106992754 A    7/2017
(Continued)

OTHER PUBLICATIONS

Abdolrazzaghi, Mohammad, et al., "An SIW Oscillator for Microfluidic Lossy Medium Characterization", 2020, IEEE, International Microwave Symposium, 4 pages.
(Continued)

*Primary Examiner* — Levi Gannon
(74) *Attorney, Agent, or Firm* — Cantor Colburn LLP

(57) ABSTRACT

An oscillator circuit includes an oscillator transistor (Q1) having respective first, second, and control terminals, the oscillator transistor being arranged to generate a microwave oscillating signal at the first terminal. A surface integrated waveguide resonator (Y1) is connected to the second terminal of the oscillator transistor (Q1). An active bias circuit portion (202) including a negative feedback arrangement is between the first terminal of the oscillator transistor (Q1) and the control terminal of the oscillator transistor (Q1), the active bias circuit portion being arranged to supply a bias current to the control terminal of the oscillator transistor (Q1). The bias current is dependent on a voltage at the first terminal of the oscillator transistor (Q1) multiplied by a negative gain.

14 Claims, 8 Drawing Sheets

(58) Field of Classification Search
CPC .. H03B 5/1829; H03B 5/1841; H03B 5/1847; H03B 5/1852; H03B 2200/0028; H03B 2200/0062; H03B 2200/009; H03B 2201/02
USPC ..................................... 331/107 DP, 107 SL
See application file for complete search history.

(56) References Cited

U.S. PATENT DOCUMENTS

| | | | |
|---|---|---|---|
| 5,097,228 A | | 3/1992 | McJunkin |
| 5,748,051 A | * | 5/1998 | Lewis .................. H03B 5/1203 331/177 V |
| 5,834,983 A | * | 11/1998 | Higgins, Jr. .............. H03L 5/00 331/109 |
| 6,018,270 A | | 1/2000 | Stubbing et al. |
| 6,104,255 A | | 8/2000 | Goma et al. |
| 6,492,874 B1 | | 12/2002 | Shih |
| 6,657,507 B2 | | 12/2003 | Fulton et al. |
| 7,532,080 B2 | | 5/2009 | Rhode et al. |
| 7,586,381 B2 | | 9/2009 | Rohde et al. |
| 7,605,670 B2 | | 10/2009 | Rohde et al. |
| 8,552,802 B2 | | 10/2013 | Kawaguchi et al. |
| 8,816,790 B2 | | 8/2014 | Sinoussi |
| 9,106,179 B2 | | 8/2015 | Trivedi et al. |
| 9,608,564 B2 | | 3/2017 | Poddar et al. |
| 9,742,380 B1 | | 8/2017 | Raj et al. |
| 2005/0046500 A1 | * | 3/2005 | Rohde ...................... H03B 5/04 331/117 R |
| 2005/0156683 A1 | * | 7/2005 | Rohde .................. H03B 5/1231 331/185 |
| 2009/0121800 A1 | | 5/2009 | Horowitz et al. |
| 2011/0193641 A1 | | 8/2011 | Clark et al. |
| 2015/0303870 A1 | * | 10/2015 | Poddar .................... H01P 7/082 331/154 |

FOREIGN PATENT DOCUMENTS

| | | |
|---|---|---|
| CN | 109030955 A | 12/2018 |
| CN | 109361046 A | 2/2019 |
| CN | 108428975 B | 10/2019 |
| CN | 107910629 B | 1/2020 |
| CN | 111245369 A | 6/2020 |
| EP | 1220440 B1 | 7/2002 |
| EP | 1542353 B1 | 6/2005 |
| EP | 1916762 B1 | 5/2018 |
| JP | S5266359 A | 6/1977 |
| WO | 2019051601 A1 | 3/2019 |

OTHER PUBLICATIONS

Bozzi, Maurizio; Review of substrate-integrated waveguide circuits and antennas Published in IET Microwaves, Antennas & Propagation; 2011; vol. 5; 15 Pages.

Dunn, John, "Active bias control", available at: https://www.edn.com/active-bias-control/, accesed Oct. 13, 2021, 9 pages.

European Search Report for application EP 20217027.0, dated Jun. 15, 2021, 13 pages.

He, F; "A Low Phase-Noise VCO Using an Electronically Tunable Substrate Integrated Waveguide Resonator" Published 2010; Materials Science; IEEE Transactions on Microwave Theory and Techniques, 14 Pages.

Poddar, Ajay K., Dr.-Ing, "Slow Wave Resonator Based Tunable Multi-Band Multi-Mode Injection-Locked Oscillators", Brandeburg University of Technology Cottbus-Senftenberg, 2013, 568 pages.

Rosu, Iulian, "Bias Circuits for RF Devices", available at: http://www.qsl.net/va3iul, accessed Oct. 13, 2021, 25 pages.

Wu, C.; "Active complementary coupled resonator for low phase noise X-band oscillator"; Published 2014 • Materials Science; European Frequency and Time Forum (EFTF), 4 Pages.

Wu, C; "A C-band tunable oscillator based on complementary coupled resonator using substrate integrated waveguide cavity", Published 2014; Materials Science; European Microwave Conference; 11 Pages.

Xu, Ziqlang; "A low phase-noise SIW reflection oscillator with hexagonal resonator" Progress In Electromagnetics Research M; vol. 68, 99-107; Jan. 2018.

* cited by examiner

| Bias circuit | Voltage $V_{cc}$ drop, % | DC current drop, % | Microwave power drop, % |
|---|---|---|---|
| a) Prior art oscillator circuit | 40 (3,3→2,0V) | 60 | 62 |
| b) Oscillator circuit 100, Fig. 1 | | 58 | 60 |
| c) Oscillator circuit 200, Fig. 2 | | 32 | 33 |

Fig. 5

OSCILLATOR CIRCUIT

FOREIGN PRIORITY

This application claims priority to European Patent Application No. 20217027.0, filed Dec. 23, 2020, and all the benefits accruing therefrom under 35 U.S.C. § 119, the contents of which in its entirety are herein incorporated by reference.

TECHNICAL FIELD

The present disclosure relates to a switchable oscillator circuit with an active bias circuit portion, particularly though not exclusively to oscillators suitable for use in impulse radar motion sensors and to such sensors comprising the switchable oscillator with an active bias circuit.

BACKGROUND

It is known to use various different sensor types to detect presences by reference to detecting objects and/or movement. For example, sensors are in context of a security system for a building, where it is desired to detect potential intruders. In addition, presence sensor devices for buildings have also been proposed for monitoring the occupancy state of a monitored zone and/or for counting a number of people that are present in a monitored zone. As well as security applications, this type of sensing is useful for identifying the presence of people during evacuations or in relation to control of building systems such as heating, ventilation and air conditioning (HVAC) systems. In this context it will be appreciated that the building may be any kind of a structure or installation where it might be required to detect people.

Radar motion sensors may have some advantages over infrared (IR) sensors such as increased resolution of detected images and an ability to detect both the presence and also the position of an intruder relative to the sensor within the detection zone of the sensor. It will be appreciated that this then allows improvements in relation to detection of multiple people and discrimination between people or other presences (e.g. animals) in circumstances where there are two separate presences within a monitored zone. This is not always possible with IR sensor systems. Another advantage of a radar sensor is that radio waves are able to penetrate through a wide range of materials, including some materials used for internal and external walls of buildings. This means that furniture in a room or even walls may not prevent a radar sensor from detecting intruders in a monitored zone that is on the other side of a wall or is in some other way obstructed in terms of visible line-of-sight. Nonetheless, known radar sensors still have some limitations and improved radar based sensor devices are desirable.

Typically, such a radar motion sensor includes an oscillator, where this oscillator is a source of the RF signals— specifically, microwave signals—that are used for the radar detection. This oscillator is a key component of such radar motion sensors and defines the radar's characteristics. An agile switchable oscillator is highly important in most radar applications with pulse modulation in order to provide good distance resolution and reduce power consumption.

In order to detect motion of a target, a radar motion sensor typically makes use of detected Doppler shifts. Those skilled in the art will appreciate that the Doppler shift is a phenomenon in which the frequency of a reflection of a transmitted signal is increased or decreased compared to the frequency of the incident transmitted signal, where the shift in frequency is dependent upon the velocity of the target. However, in order for this to work, it is important for the system to have relatively low 'phase noise', i.e. fluctuations in the phase of the signal.

The requirement for low phase noise for the microwave signals in radar motion sensors is especially important when detecting targets with a small Doppler frequency shift, e.g. slow-moving targets, crawling targets, or targets moving along a tangent path.

Some solutions, known in the art per se, make use of a voltage-controlled oscillator (VCO) with a phase-locked loop (PLL). An arrangement using a VCO and PLL may provide excellent frequency stability and low phase noise. However, the Applicant has appreciated that a PLL is relatively slow, with start-up time typically exceeding 3 μs, and in some cases reaching approximately 200 μs. This slow start-up time means that such an arrangement is not suitable for high frequency operation, in which the oscillator is operated in a pulsed mode, because the time taken to turn on exceeds the desired pulse duration. Some sensors that use a PLL employ frequency-modulated continuous-wave (FMCW) modulation, however this is inappropriate for battery or low-power applications due to the associated high power consumption.

It has been appreciated that in a battery operated device, the nominal supply voltage from the battery may drop as the battery depletes, and over the lifetime of the battery. This reduced 'voltage stability' may lead to issues in transistor-based oscillators because the frequency and output power of the oscillator is dependent on the supply voltage from the battery.

Thus the Applicant has appreciated the need for an agile switchable oscillator with low phase noise that is particularly well-suited to radar motion sensors, so as to provide such sensors with improved distance resolution, slow-moving target detection and reduce power consumption. For example, an oscillator with fast start-up time, low phase noise and improved voltage stability would be highly beneficial for modern radar motion sensors to improve its performance.

There are some arrangements, known in the art per se, dedicated to lower frequency (e.g. UHF band less than 3 GHz) RF oscillators that make use of active bias circuits in order to reduce its phase noise. However, these generally provide low quality factor (also referred to as 'Q-factor' or simply 'Q') resonators and are not well-suited to higher frequency (e.g. microwave) applications. Thus, the Applicant has appreciated that it would be particularly advantageous to provide a switchable oscillator with an active bias circuit more suited for use in microwave (by way of example only, approximately 10 GHz) oscillators.

SUMMARY

When viewed from a first aspect, the present invention provides an oscillator circuit comprising: an oscillator transistor having respective first, second, and control terminals, said oscillator transistor being arranged to generate a microwave oscillating signal at the first terminal thereof; a surface integrated waveguide resonator connected to the second terminal of the oscillator transistor; and an active bias circuit portion comprising a negative feedback arrangement between the first terminal of the oscillator transistor and the control terminal of the oscillator transistor, the active bias circuit portion being arranged to supply a bias current to the control terminal of the oscillator transistor, wherein said bias current is dependent on a voltage at the first terminal of the oscillator transistor multiplied by a negative gain.

This first aspect of the present invention extends to an impulse radar motion sensor comprising the oscillator circuit outlined hereinabove, wherein the impulse radar motion sensor is arranged to transmit said microwave oscillating signal to an external environment and to receive reflections of said microwave oscillating signal.

Thus the first aspect of the invention extends to an impulse radar motion sensor comprising an oscillator circuit comprising: an oscillator transistor having respective first, second, and control terminals, said oscillator transistor being arranged to generate a microwave oscillating signal at the first terminal thereof; a surface integrated waveguide resonator connected to the second terminal of the oscillator transistor; and an active bias circuit portion comprising a negative feedback arrangement between the first terminal of the oscillator transistor and the control terminal of the oscillator transistor, the active bias circuit portion being arranged to supply a bias current to the control terminal of the oscillator transistor, wherein said bias current is dependent on a voltage at the first terminal of the oscillator transistor multiplied by a negative gain; wherein the impulse radar motion sensor is arranged to transmit said microwave oscillating signal to an external environment and to receive reflections of said microwave oscillating signal.

Thus it will be appreciated by those skilled in the art that embodiments of the present invention provide an improved oscillator circuit, and a radar motion sensor comprising the same, that may exhibit improved phase noise characteristics compared to conventional oscillator circuits known in the art per se. The negative feedback afforded by the active bias circuit may advantageously act to stabilise the DC bias voltage of the oscillator transistor, reduces the degradation of the oscillator's parameters which, together with the high-Q SIW resonator, to reduces the phase noise. Due to the reduction in phase noise, the oscillator may provide for improved detection of slow-moving targets. By way of non-limiting example, the oscillator of the present invention may be able to detect targets moving at less than 0.1 m/s.

An oscillator in accordance with embodiments of the present invention may also exhibit an improved start-up time compared to conventional oscillators, as switching the power to the active bias circuit also switches power to the oscillator transistor. By switching the active bias circuit to modulate the current supplied to the control terminal of the oscillator transistor, faster switching speeds may be achieved than is possible by switching the oscillator transistor's supply voltage (Vcc). For example, the oscillator may achieve a start-up time less than 10 ns, and in some cases less than 4 ns, e.g. less than 2.3 ns. This significant reduction in start-up time (compared to the 0.5-3 µs start-up time associated with conventional oscillators, and 3-200 µs start-up time for solutions that utilise a VCO in combination with a PLL) may advantageously provide for improvements in the distance resolution of an impulse radar motion sensor utilising the oscillator of the present invention. By way of non-limiting example, a distance resolution of less than 2 m may be achieved.

Additionally, as outlined above, conventional radar motion sensors may have a higher associated power consumption than might otherwise be desirable, particularly if used within a battery-powered device. However, the arrangement of the present invention may provide improved stability of the oscillator's parameters (e.g. output power and frequency) across a wide range of supply voltages. This may be particularly beneficial for a battery powered radar motion detector devices, because when the battery is discharged and the supplying voltage drops, the oscillator parameters are less impacted than with a conventional arrangement. The oscillator of the present invention may also exhibit improved temperature stability.

Furthermore, an oscillator in accordance with the present disclosure may be implemented at low cost, and be implemented with a relatively compact layout.

Those skilled in the art will appreciate that a surface integrated waveguide resonator provides a cavity exhibiting a relatively high quality factor and a high feasibility and planar integration using multi-layered printed circuit board (PCB), low-temperature co-fired ceramic (LTCC) technologies and monolithic microwave integrated circuits (MMICs).

The oscillator transistor is the source of the microwave signal that can be used as the output of a radar motion sensor. While there are a number of different transistor technologies that may be used for this component, in preferred embodiments the oscillator transistor comprises a bipolar junction transistor (BJT). Those skilled in the art will appreciate that a BJT typically exhibits very low flicker (1/f) noise, which makes it well suited for oscillators with low-phase noise.

In a particular set of embodiments, the oscillator transistor comprises an npn BJT. In a set of such embodiments, the first terminal of the oscillator transistor is a collector terminal, the second terminal of the oscillator transistor is an emitter terminal, and the control terminal of the oscillator transistor is a base terminal. Thus the active bias circuit provides a negative collector-base parallel feedback arrangement, such that the base current is reduced when the collector current (and similarly, the voltage drop across the resistor connected to the collector) is increased.

Therefore, carefully setting the values of the DC current, stabilising the transistor's operational point, and providing negative feedback at low frequencies may reduce the phase noise of the oscillator.

As outlined above, the active bias circuit provides a negative feedback loop, in which the voltage at the first terminal (e.g. the collector in the case of BJT) of the oscillator transistor is taken (or a part of that voltage is taken) and subjected to a negative gain to generate the current supplied to the control (e.g. the base in the case of BJT) of the oscillator transistor. Thus the active bias circuit acts as a negative transconductance amplifier positioned between the first and control terminals of the oscillator transistor.

Different topologies could be used for the active bias circuit. However, in a set of embodiments, the active bias circuit comprises a first feedback transistor having respective first, second, and control terminals, said first feedback transistor being arranged such that: the first terminal of the first feedback transistor is connected to the first terminal of the oscillator transistor via first feedback path; and the second terminal of the first feedback transistor is connected to the control terminal of the oscillator transistor via a second feedback path.

The first feedback transistor may comprise any suitable transistor. However, in a set of embodiments, the first feedback transistor comprises a pnp BJT, wherein its first terminal is an emitter terminal, its second terminal is a collector terminal, and its control terminal is a base terminal.

The first feedback path may, in a set of embodiments, comprise first and second resistors arranged such that: a first terminal of the first resistor is connected to a supply voltage; a second terminal of the first resistor is connected to the first terminal of the first feedback transistor and to a first terminal of the second resistor; and a second terminal of the second resistor is connected to the first terminal of the oscillator transistor.

In a set of such embodiments, a first capacitor may be connected between the first terminal of the first resistor and ground. In a set of potentially overlapping embodiments, a second capacitor may be connected between the second terminal of the second resistor and ground. The first and second resistors are the collector resistors that set the collector current and define the voltage drop Vcc-Vc. These two resistors form a voltage divider, which regulates a 'deepness' of the negative feedback. The first capacitor is a decoupling capacitor. The second capacitor, where provided, in combination with the second resistor may provide a low-pass filter characteristic such that high frequency signals at the first terminal of the oscillator transistor are attenuated by the first feedback path to avoid unwanted parasitic oscillations at frequencies different from the operational one.

The second feedback path may comprise third and fourth resistors arranged such that: a first terminal of the third resistor is connected to the second terminal of the first feedback transistor; a second terminal of the third resistor is connected to a first terminal of the fourth resistor and to the control terminal of the oscillator transistor; and a second terminal of the fourth resistor is connected to ground.

This third resistor provides additional attenuation of high frequency signals within the collector-base feedback loop of the oscillator transistor so as to avoid unwanted parasitic oscillations at frequencies different from the operational one. The fourth resistor may improve the turn-on/off time of the oscillator.

Thus it will be appreciated that the first feedback transistor and surrounding feedback path circuitry provides negative parallel feedback (e.g. negative collector-base parallel feedback) at low frequencies in order to stabilize the DC voltage and current variations of the oscillator transistor, to minimise degradation of the oscillator's parameters, reduce 1/f flicker noise, and to reduce phase noise.

Further improvements may be achieved by increasing the negative feedback. In some embodiments, the oscillator circuit further comprises a second feedback transistor having respective first, second, and control terminals, said second feedback transistor being arranged such that: the first terminal of the second feedback transistor is connected to the supply voltage via a fifth resistor; the second terminal of the second feedback transistor is connected to the control terminal of the first feedback transistor; and the control terminal of the second feedback transistor is connected to the first terminal of the first feedback transistor via a third feedback path.

The second feedback transistor may advantageously increase the negative feedback to achieve higher dc stability of the oscillator transistor and to further reduce phase noise. Furthermore, the second feedback transistor may significantly improve temperature stability of the oscillator transistor.

The second feedback transistor may comprise any suitable transistor. However, in a set of embodiments, the second feedback transistor comprises a pnp BJT, wherein its first terminal is an emitter terminal, its second terminal is a collector terminal, and its control terminal is a base terminal.

The fifth resistor may have a first terminal thereof connected to the first terminal of the second feedback transistor, and a second terminal thereof connected to the supply voltage and to the first terminal of the first resistor in the first feedback path, where this first resistor may also form part of the third feedback path.

A sixth resistor may have a first terminal thereof connected to the second terminal of the fifth resistor, and a second terminal thereof connected to the second terminal of the second feedback transistor and the control terminal of the first feedback transistor.

The third feedback path may comprise a seventh resistor having a first terminal thereof connected to the control terminal of the second feedback transistor, and a second terminal thereof connected to the first terminal of the first feedback transistor and to the second terminal of the first resistor in the first feedback path, where this first resistor may also form part of the third feedback path. Thus the voltage at the first terminal (e.g. the emitter terminal) of the first feedback transistor is applied to the control terminal (e.g. the base terminal) of the second feedback transistor via this seventh resistor.

As outlined previously, relatively fast start-up speeds may be achieved with the oscillator circuit of the present invention because the active bias circuit itself can be switched, thereby switching the current to the control terminal (e.g. the base terminal) of the oscillator transistor. In some embodiments, the oscillator circuit further comprises a switching transistor having respective first, second, and control terminals, said switching transistor being arranged such that a control signal applied to the control terminal of said switching transistor varies a current through the first and second terminals of said switching transistor, wherein the current supplied to the control terminal of the oscillator transistor is dependent on the current through the first and second terminals of said switching transistor. This switching transistor may form part of the active bias circuit portion, or it may be external to the active bias circuit portion. Alternatively, the switching transistor may form part of an external controlling circuit, for example a microprocessor.

The switching transistor may comprise any suitable transistor. However, in a set of embodiments, the switching transistor comprises an npn BJT, wherein its first terminal is a collector terminal, its second terminal is an emitter terminal, and its control terminal is a base terminal. In alternative embodiments, the switching transistor may comprise metal-oxide-semiconductor field-effect-transistor (MOSFET).

In a set of such embodiments, an eighth resistor may be arranged such that a first terminal thereof is connected to the first terminal of the switching transistor, and a second terminal thereof is connected to the control terminal of the first feedback transistor. Where the second feedback transistor is provided, the second terminal of the eighth resistor may also be connected to the second terminal of the second feedback transistor. The second terminal of the switching transistor may be connected to ground.

Microstrip lines (MSL) may, in some embodiments, be used to 'tune' the characteristics of the microwave circuit, i.e. the circuitry surrounding the oscillator transistor that impacts the propagation of the generated microwave oscillating signal. Thus while the 'connections' to the first and control terminals of the oscillator transistor, particularly in relation to the connections of the active bias circuit, outlined above may be direct, these connections may, at least in some embodiments, be via one or more microstrip lines connected to one or more of the oscillator transistor terminals.

Firstly, in respect of the control terminal of the oscillator transistor, the oscillator circuit may comprise first, second, and third microstrip lines, arranged such that: the first microstrip line has a first end thereof connected to the control terminal of the oscillator transistor, and a second end thereof is open-ended; the second microstrip line has a first end thereof connected to the first end of the first microstrip line and the control terminal of the oscillator transistor; and the third microstrip line has a first end thereof connected to a second end of the second microstrip line, and a second end thereof is open-ended; wherein the first end of the third microstrip line and second end of the second microstrip line are connected to the active bias circuit.

Those skilled in the art will appreciate that as the first microstrip line is open-ended, it drives the transistor into an unstable operational region and influences the frequency. Generally, this first microstrip line may be a quarter wavelength ($\lambda g/4$) long, where the wavelength ($\lambda g$) is the wavelength of the microwave signal of interest, generated by the oscillator transistor, in the substrate. The second and third microstrip lines behave as a band-stop filter for the frequency of the microwave signal of interest, and may also be a quarter wavelength ($\lambda g/4$) long.

The first, second, and third microstrip lines may form part of the second feedback path. In particular, the first end of the third microstrip line and second end of the second microstrip line may, in a particular set of embodiments, be further connected to the second terminal of the third resistor and to the first terminal of the fourth resistor, where provided.

Additionally or alternatively, a plurality of microstrip lines may also be connected to the first terminal of the oscillator transistor. In a particular set of embodiments, the oscillator circuit comprises fourth and fifth microstrip lines, arranged such that: the fourth microstrip line has a first end thereof connected to the first terminal of the oscillator transistor; and the fifth microstrip line has a first end thereof connected to a second end of the fourth microstrip line, and a second end thereof is open-ended.

The fourth and fifth microstrip lines may behave as a band-stop filter for the frequency of the microwave signal of interest, and may also be a quarter wavelength ($\lambda g/4$) long.

As outlined above, the oscillator generates the microwave oscillating signal at the first terminal of the oscillator transistor, which is seen as a complex impedance with a negative resistance and arbitrary reactance. This may be taken as the output of the oscillator, however further components may be connected between the first terminal of the oscillator transistor and an output terminal of the oscillator in order to match this transistor's output impedance to the oscillator's output terminal, which may, by way of example only, be approximately 50 Ohms. For example, in some embodiments, a matching circuit is connected between the first terminal of the oscillator transistor and an output terminal of the oscillator circuit. The matching circuit may, in some embodiments, comprise sixth and seventh microstrip lines and a bandpass filter.

Where provided, the sixth microstrip line may have a first end thereof connected to the first end of the fourth microstrip line and to the first terminal of the oscillator transistor, and a second end thereof open ended. The bandpass filter may be connected between the first terminal of the oscillator transistor and an output terminal of the oscillator.

Where provided, the respective first ends of the fourth and sixth microstrip lines may be connected to an input to the bandpass filter. A seventh microstrip line may, in some embodiments, be connected such that a first end thereof is connected to the output terminal of the oscillator and to an output of the bandpass filter, wherein a second end of said seventh microstrip line is open-ended.

This matching circuit transforms the load (i.e. output) impedance to suitable values at the first terminal (e.g. collector terminal) of the oscillator transistor to provide conjugate matching. The bandpass filter may substantially attenuate (i.e. 'filter out') signals having a frequency (or equivalently, wavelength) outside of a particular range as determined by that bandpass filter and filters out both higher harmonics and DC components from the microwave oscillation signal.

While the connection between the second terminal of the oscillator transistor and the surface integrated waveguide resonator may be direct, in some embodiments, an eighth microstrip line may be connected between these. In other words, a first end of the eighth microstrip line may be connected to the second terminal of the oscillator transistor, and a second end of the eighth microstrip line may be connected to the surface integrated waveguide resonator.

As outlined above, a bandpass filter may be connected between the first terminal of the oscillator transistor and the output terminal of the oscillator circuit. While this filter may be a dedicating filtering circuit, in a particular set of embodiments the bandpass filter may be replaced by a microstrip line. This microstrip line possesses the desired wave impedance and electrical length and transforms the impedance and may not exhibit bandpass filter characteristics. Thus in some embodiments, a ninth microstrip line may be connected between the first terminal of the oscillator transistor and an output terminal of the oscillator circuit. Thus in some embodiments, the respective first ends of the fourth and sixth microstrip lines may be connected to a first end of a ninth microstrip line, wherein a second end of said ninth microstrip line is connected to the output terminal of the oscillator (and optionally to the first end of the seventh microstrip line, where provided).

BRIEF DESCRIPTION OF THE DRAWINGS

Certain embodiments of the present disclosure will now be described with reference to the accompanying drawings, in which:

FIG. 5 is a table showing various parameters relating to different oscillator circuits;

DETAILED DESCRIPTION

Figure 1:
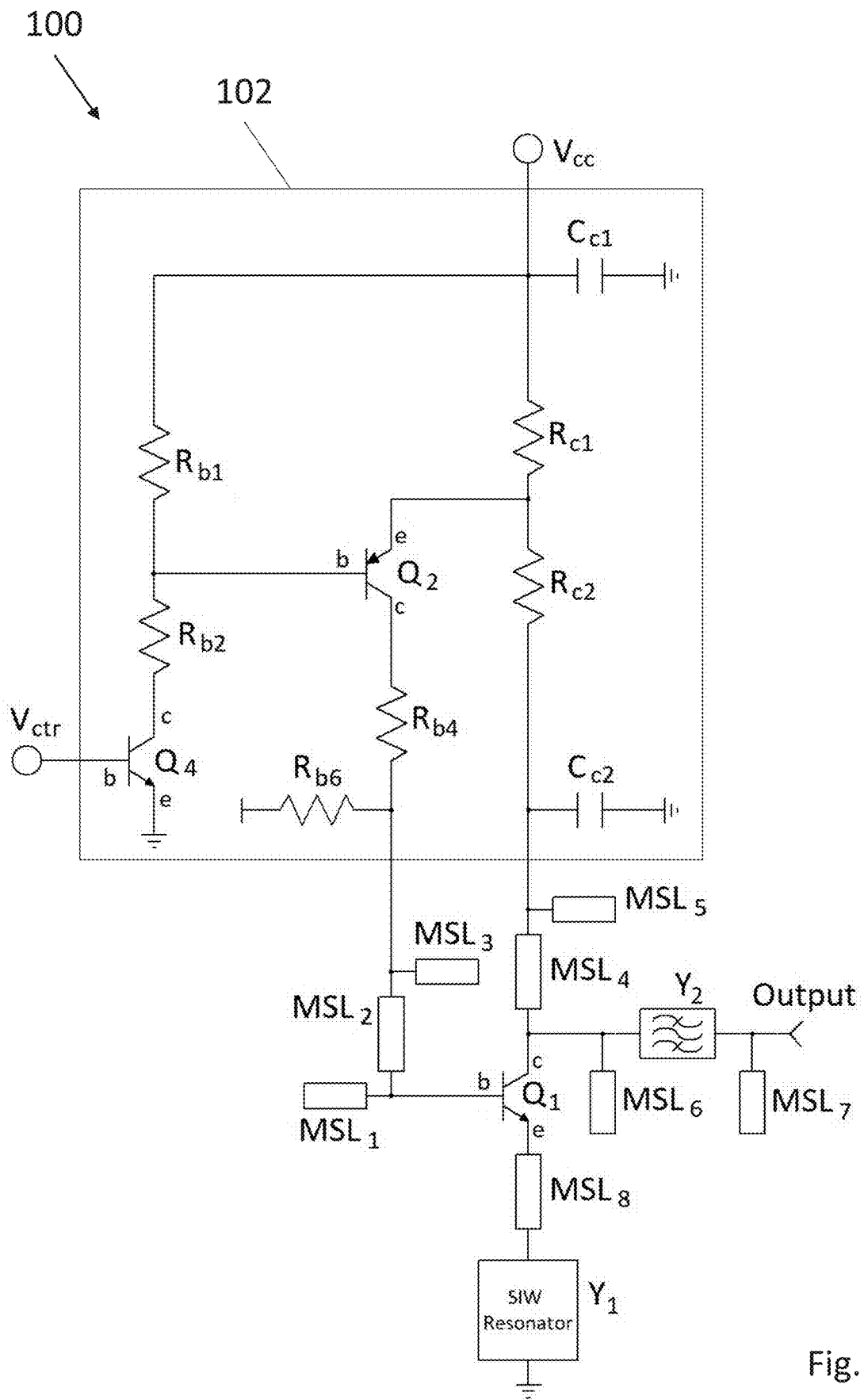
FIG. 1 is a circuit diagram of an oscillator in accordance with an embodiment of the present invention in which a single-stage feedback arrangement is used to provide the negative collector-base parallel feedback.

FIG. 1 is a circuit diagram of an oscillator circuit 100 in accordance with an embodiment of the present invention in which a single-stage feedback arrangement is used to provide the negative collector-base parallel feedback.

The oscillator circuit 100 comprises an oscillator transistor Q1 which, in this particular embodiment, is an npn BJT.

This oscillator transistor Q1 has respective collector (first), emitter (second), and base (control) terminals. The oscillator transistor Q1 is arranged to generate a microwave oscillating signal at its collector terminal, where this microwave oscillating signal is, subject to further processing steps outlined below, provided as an output. In particular, this output signal is a high frequency microwave signal (e.g. approximately 10 GHz) suitable for use in a radar motion sensor.

The oscillator circuit 100 also comprises: an active bias circuit 102 (the components of which are explained in further detail below); a surface integrated waveguide (SIW) resonator $Y_1$; a bandpass filter $Y_2$; and a number of microstrip lines $MSL_{1-8}$.

The SIW resonator $Y_1$ is connected to the emitter terminal of the oscillator transistor $Q_1$ and thus connects the emitter to ground, where $MSL_8$ is connected between the emitter terminal of the oscillator transistor $Q_1$ and the SIW resonator $Y_1$.

The active bias circuit portion 102 provides a negative feedback arrangement between the collector and base terminals of the oscillator transistor $Q_1$. As explained in more detail below, this negative feedback arrangement is arranged to supply a biasing base current $I_b$ to the base terminal of the oscillator transistor $Q_1$, where the base current $I_b$ is dependent on a voltage Vc at the collector terminal of the oscillator transistor $Q_1$, multiplied by a negative gain. In other words, the active bias circuit portion 102 acts as a negative transconductance amplifier connected between the collector and base terminals of the oscillator transistor $Q_1$.

In order to provide this negative collector-base parallel feedback, the active bias circuit portion 102 comprises a feedback transistor $Q_2$, which in this embodiment is a pnp BJT having respective emitter (first), collector (second), and base (control) terminals.

This feedback transistor $Q_2$ is arranged such that its emitter terminal is connected to the collector terminal of the oscillator transistor $Q_1$ via first feedback path constructed from a pair of resistors $Rc_1$, $Rc_2$; a pair of capacitors $Cc_1$, $Cc_2$; and two of the microstrip lines $MSL_4$ and $MSL_5$.

The first terminal of the first of these resistors $Rc_1$ is connected to the supply voltage Vcc, while the other terminal of that resistor $Rc_1$ is connected to the emitter terminal of the feedback transistor $Q_2$ and to a first terminal of the second of the resistors $Rc_2$. The other terminal of the second resistor $Rc_2$ is connected to the collector terminal of the oscillator transistor $Q_1$.

One of the capacitor $Cc_1$ is connected between the first terminal of the first resistor $Rc_1$ and ground. The other capacitor $Cc_2$ is connected between the second terminal of the second resistor $Rc_2$ and ground. The first capacitor $Cc_1$ is a decoupling capacitor. The second capacitor $Cc_2$ in combination with the resistors $Rc_2$ and $Rb_4$ provide a low pass filter.

The collector terminal of the feedback transistor $Q_2$ is connected to the base terminal of the oscillator transistor $Q_1$ via a second feedback path constructed from a further pair of resistors $R_{b4}$, $R_{b6}$ and three of the microstrip lines $MSL_{1-3}$.

A first of these resistors $R_{b4}$ is arranged such that one of its terminals is connected to the collector terminal of the first feedback transistor $Q_2$. The other terminal of this resistor $R_{b4}$ is connected to a first terminal of the other resistor $R_{b6}$ and to the base terminal of the oscillator transistor $Q_1$. Thus this second feedback path 'closes the loop' back from the collector terminal of $Q_1$ to the base terminal of $Q_1$. The other terminal of the second resistor $R_{b6}$ in the second feedback path is connected to ground.

The low-pass filter comprising the capacitor $C_{c2}$ and the resistors $R_{c2}$ and $R_{b4}$ results in the signal at the collector terminal of the oscillator transistor $Q_2$ being subjected to filtering across the closed feedback loop before being applied to the control terminal of the oscillator transistor $Q_1$.

Thus the feedback transistor $Q_2$ and the feedback path circuitry outlined above provides negative collector-base parallel feedback to the oscillator transistor $Q_1$. This helps to stabilize the DC voltage and current variations of the oscillator transistor $Q_1$, to minimise degradation of the oscillator's parameters, and to reduce phase noise.

The oscillator circuit also includes a switching transistor $Q_4$—in this case an npn BJT—having respective collector, emitter, and base terminals. This switching transistor $Q_4$ is arranged to receive a control signal $V_{ctr}$—i.e. a control voltage—at its base terminal, as outlined in further detail below.

The switching transistor $Q_4$ is arranged such that it is connected to the rest of the oscillator circuit 100 via a pair of resistors $R_{b1}$, $R_{b2}$. The first of these resistors $R_{b1}$ is connected such that one terminal of the resistor $R_{b1}$ is connected to the supply voltage $V_{cc}$—specifically at the node at which the first resistor $R_{c1}$ and first capacitor $C_{c1}$ of the first feedback path are connected to the supply voltage $V_{cc}$. The other terminal of the resistor $R_{b1}$ is connected to the base terminal of the feedback transistor $Q_2$ and to one of the terminals of the other resistor $R_{b2}$, the other end of which is connected to the collector terminal of the switching transistor $Q_4$. The emitter terminal of the switching transistor $Q_4$ is connected to ground.

Varying the control signal $V_{ctr}$ varies a the collector-emitter current through the switching transistor $Q_4$. Due to its connection to the feedback transistor $Q_2$, inhibiting the collector-emitter current through the switching transistor $Q_4$ also inhibits the collector-emitter current through the feedback transistor $Q_2$. Due to the base current $I_b$ supplied to the base terminal of the oscillator transistor $Q_1$ being dependent on the feedback loop through the feedback transistor $Q_2$, inhibiting the collector-emitter current through $Q_2$ also inhibits the base current $I_b$.

Thus, the base current $I_b$ supplied to the base terminal of the oscillator transistor $Q_1$ is ultimately dependent on the current through the switching transistor $Q_4$. As a result, the switching transistor $Q_4$ provides a simple way to switch the entire oscillator circuit 100. This provides for relatively fast start-up because the active bias circuit 102 itself can be switched, thereby switching the current to the base terminal of the oscillator transistor $Q_1$. As outlined previously, having a fast start-up time makes the arrangement of the present invention particularly well-suited to high frequency pulse operation.

While the switching transistor $Q_4$ may be part of the active bias circuit portion 102 as shown in FIG. 1, it will be appreciated that the switching transistor $Q_4$ may not necessarily be an standalone components and may, for example, form part of an external controlling circuit, e.g. a microprocessor (not shown).

The $MSL_{1-8}$ may be used to 'tune' the characteristics of the microwave circuit, i.e. the circuitry surrounding the oscillator transistor $Q_1$. These $MSL_{1-8}$ act together to set the resonant frequency of the microwave circuit and to filter out unwanted frequencies.

The first $MSL_1$ is connected at one end to the base terminal of the oscillator transistor $Q_1$, while it's other end is open-ended (i.e. unconnected). The second $MSL_2$ has one end connected to the first end of $MSL_1$ and the base terminal of the oscillator transistor $Q_1$. The third $MSL_3$ is connected such that one end is connected to the second end of MSL$_2$ (i.e. to the end that is not connected to MSL$_1$) while the other end of MSL$_3$ is open-ended. The node connecting the first end of MSL$_3$ and the second end of MSL$_2$ is further connected to the active bias circuit 102, and specifically to the node connecting R$_{b4}$ and R$_{b6}$. Thus MSL$_{1-3}$ can be seen as forming part of the second feedback path, i.e. they sit between the collector terminal of the feedback transistor Q$_2$ and the base terminal of the oscillator transistor Q$_1$.

As MSL$_1$ is open-ended, its dimensions significantly influence the microwave frequency. Generally, MSL$_1$ may be a quarter wavelength ($\lambda_g/4$) long, where the wavelength ($\lambda_g$) is the wavelength of the microwave signal of interest, i.e. the signal generated by the oscillator transistor Q$_1$, in the substrate. It will also be appreciated that MSL$_2$ and MSL$_3$ provide a band-stop filter transfer function, acting to isolate microwave frequency components, preventing them flowing through the bias circuit.

MSL$_4$ and MSL$_5$ similarly form part of the first feedback path. Specifically, MSL$_4$ is connected at one end to the collector terminal of the oscillator transistor Q$_1$, and at the other end to a first end of MSL$_5$. The other end of MSL$_5$ is open-ended.

As outlined above, the oscillator circuit 100 generates the microwave oscillating signal at the collector terminal of the oscillator transistor Q$_1$. The output matching circuit, comprising MSL$_{6-7}$ and the bandpass filter Y$_2$, is connected between the collector of the oscillator transistor Q$_1$ and the output terminal of the oscillator circuit 100. The bandpass filter Y$_2$ is connected between the collector of the oscillator transistor Q$_1$ and the output terminal of the oscillator circuit 100 and acts to attenuate signals having a frequency outside of a particular 'pass band' range. As can be seen in FIG. 1, the node at which MSL$_4$ and MSL$_6$ are connected is further connected to the input of the bandpass filter Y$_2$. MSL$_6$ has one end connected to the first end of MSL$_4$ (i.e. the end of MSL$_4$ that is not connected to MSL$_5$) and to the collector terminal of the oscillator transistor Q$_1$. The other end of MSL$_6$ is open-ended. MSL$_7$ is connected such that one end of MSL$_7$ is connected to the output terminal of the oscillator circuit 100 and to the output of the bandpass filter Y$_2$, and the other end of MSL$_7$ is open-ended.

The output matching circuit, comprising MSL$_{6-7}$ and the bandpass filter Y$_2$, transforms the load (output) impedance to a value suitable for the collector terminal of the oscillator transistor Q$_1$ to provide conjugate matching. The bandpass filter Y$_2$ filters out both higher harmonics and DC components from the microwave oscillation signal generated by Q$_1$.

The connection between the emitter of the oscillator transistor Q$_1$ and the SIW Y1 could be direct, however in this particular embodiment MSL$_8$ is connected between these. MSL$_8$ transforms the input impedance of the SIW resonator Y$_1$ to certain values at the Q$_1$ emitter in order to obtain a negative resistance at the Q$_1$ collector at the frequency of interest.

In accordance with Leeson's equation, the power spectral density of the oscillator's phase noise may be described as (D. B. Leeson "A simple model of feedback oscillator noise spectrum" Proceedings of the IEEE, Volume: 54, Issue: 2, Pages: 329-330, February 1966):

$$S_\phi(\omega_m) = \left[\frac{\alpha}{\omega_m} + \frac{FkT}{P_s}\right] \cdot \left[1 + \left(\frac{\omega_0}{2Q_L\omega_m}\right)^2\right]$$

where α—a constant determined by the magnitude of 1/f variations (flicker noise) of an active device;

Q$_L$—loaded quality factor of a resonator in an oscillator;
ω$_m$—carrier offset radian frequency, rad/sec;
ω$_0$—carrier radian frequency, rad/sec;
P$_s$—the signal level at an oscillator active element, W;
F—noise factor of the oscillator transistor;
k—Boltzman constant; and
T—temperature, K.

From the equation above it follows that the main contributors to the phase noise of the oscillator are the resonator's loaded quality factor and the flicker noise of the active device.

The l/f flicker noise in BJT may be represented by the current noise spectrum density that is expressed as (J. L. Plumb and E. R. Chenette, "Flicker Noise in Transistors," IEEE Trans. Electron Devices, vol. ED-10, pp. 304-308, September 1963)

$$S_{IB} = \frac{KI_B^n}{f}$$

where I$_B$—base current, A;
K—a constant depending on transistor's technology;
n—a constant usually from 1 to 2; and
f—offset frequency, (Hz).

Therefore, it is highly important to provide the oscillator circuit with high-Q resonator and feedback techniques, which reduce flicker noise (l/f noise) and stabilize DC current in order to achieve good phase noise signal performance.

Figure 2:
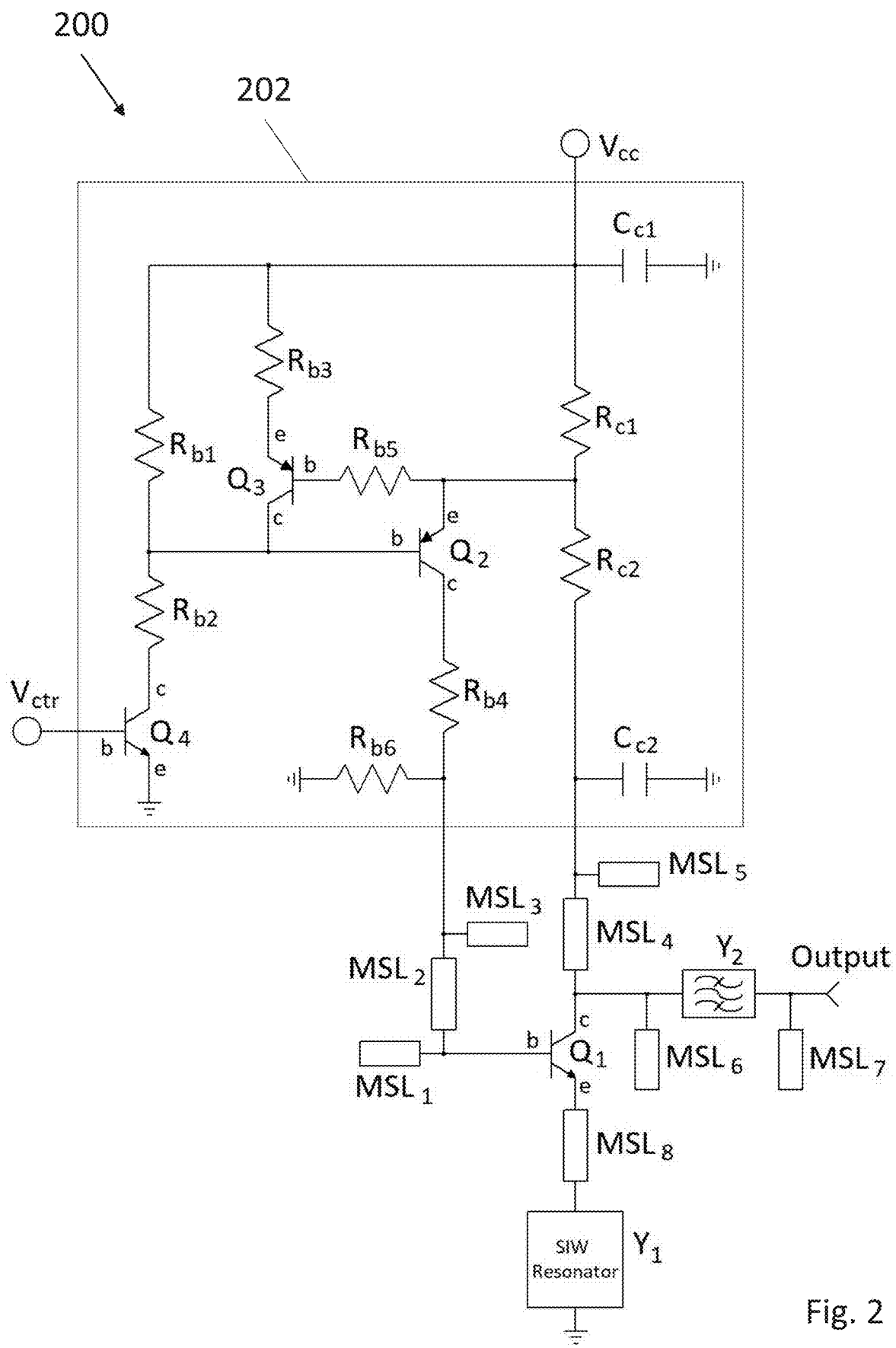
FIG. 2 is a circuit diagram of an oscillator in accordance with a further embodiment of the present invention in which a two-stage feedback arrangement is used to provide the negative collector-base parallel feedback.
Figure 7:
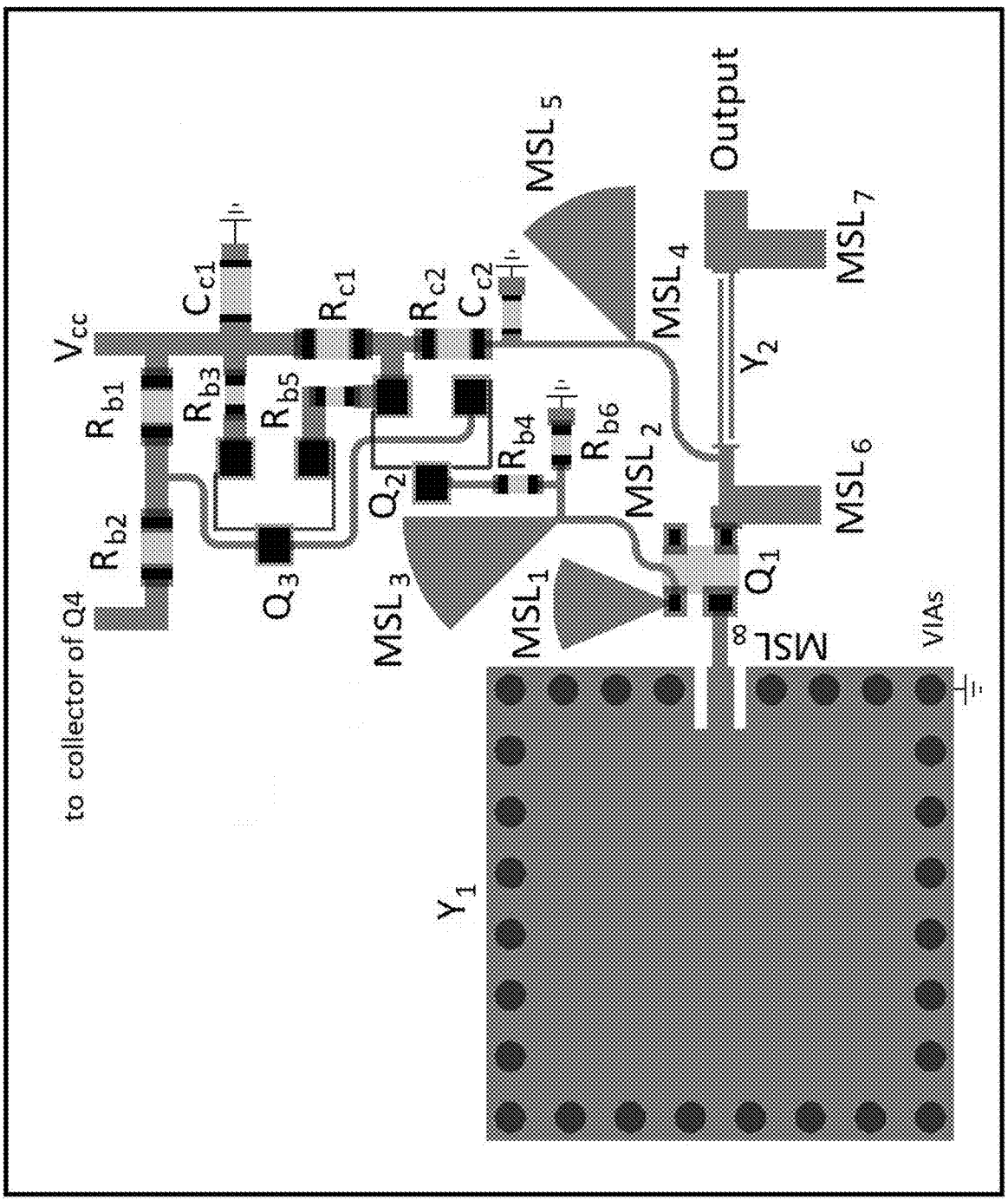
FIG. 7 is a microwave circuit layout for the oscillator circuit of FIG. 2.

FIG. 2 is a circuit diagram of an oscillator circuit 200 in accordance with a further embodiment of the present invention in which a two-stage feedback arrangement is used to provide the negative collector-base parallel feedback. An example of a suitable microwave circuit layout for the oscillator circuit 200 is shown in FIG. 7.

The oscillator circuit 200 of FIG. 2 is similar in structure and function to the oscillator circuit 100 of FIG. 1. As such, for ease of reference, components having a reference numeral appended starting with a '2' are alike in structure and function to those components having the same reference numeral starting with a '1' described previously with reference to FIG. 1, unless context dictates otherwise. Thus a component having reference numeral '2xx' in FIG. 2 should be assumed to be alike in form and function to the component having reference numeral '1xx' in FIG. 1, unless otherwise specified.

The oscillator circuit 200 of FIG. 2 provides further improvements in the negative feedback arrangement. In addition to the components of the oscillator circuit 100 of FIG. 1, the oscillator circuit 200 of FIG. 2 further comprises a second feedback transistor Q3, which in this embodiment is a pnp BJT having respective emitter (first), collector (second), and base (control) terminals.

The emitter terminal of the second feedback transistor Q$_3$ is connected to the supply voltage via resistor R$_{b3}$. The collector terminal of the second feedback transistor Q$_3$ is connected to the base terminal of the first feedback transistor Q$_2$, and the base terminal of the second feedback transistor Q$_3$ is connected to the emitter terminal of the first feedback transistor Q$_2$ via a third feedback path, as outlined in further detail below.

This second feedback transistor Q$_3$ advantageously increases the negative feedback to achieve higher dc stability of the oscillator transistor $Q_1$ and to further reduce phase noise. Furthermore, the second feedback transistor $Q_3$ provides significant improvements to temperature stability of the oscillator transistor $Q_1$.

The third feedback path comprises an additional resistor $R_{b5}$ connected between the base terminal of the second feedback transistor $Q_3$ and the emitter terminal of the first feedback transistor $Q_2$, at the node that connects $R_{c1}$ and $R_{c2}$ in the first feedback path. Thus, the voltage at the emitter terminal of the first feedback transistor $Q_2$ is applied to the base terminal of the second feedback transistor $Q_3$ via $R_{b5}$.

$R_{b1}$, described previously, is now connected to between $R_{b3}$ and the node at which the collector terminal of the second feedback transistor $Q_3$ and the control terminal of the first feedback transistor $Q_2$ are connected.

A further resistor $R_{b3}$ is connected between the emitter terminal of the second feedback transistor $Q_3$ and the supply voltage Vcc at the node that connected $R_{c1}$ and $C_{c1}$ in the first feedback path. Thus the voltage at the emitter terminal of the first feedback transistor $Q_2$ is applied to the base terminal of the second feedback transistor $Q_3$ via $R_{b5}$.

Thus due to this arrangement, the second feedback transistor $Q_3$ drives the base current of the first feedback transistor $Q_2$, and the first feedback transistor $Q_2$ drives the base current $I_b$ of the oscillator transistor $Q_1$ and, consequently, controls the collector current of the oscillator transistor $Q_1$.

Figure 3:
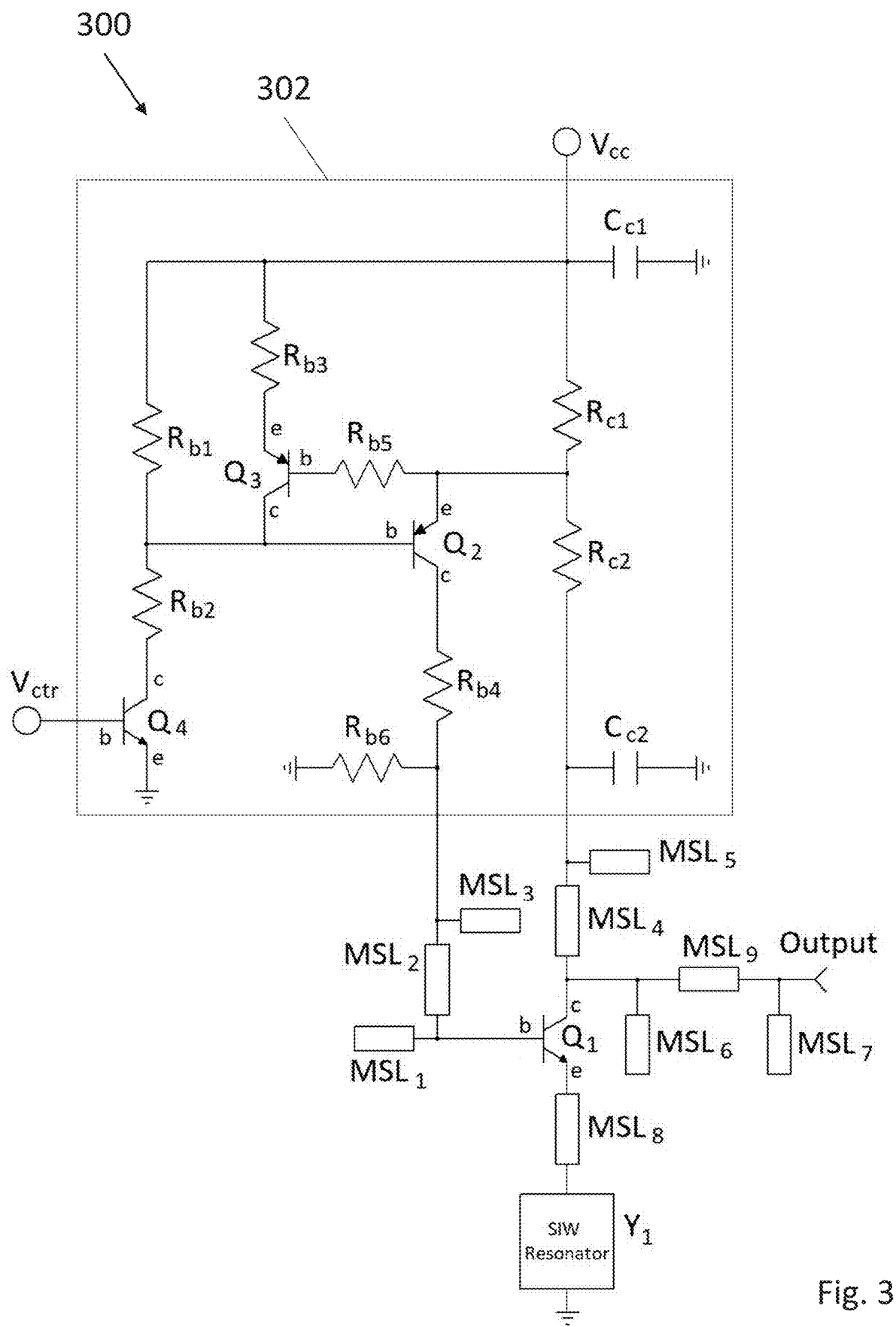
FIG. 3 is a circuit diagram of an oscillator in accordance with a further embodiment of the present invention in which the bandpass filter is replaced with a microstrip line.
Figure 8:
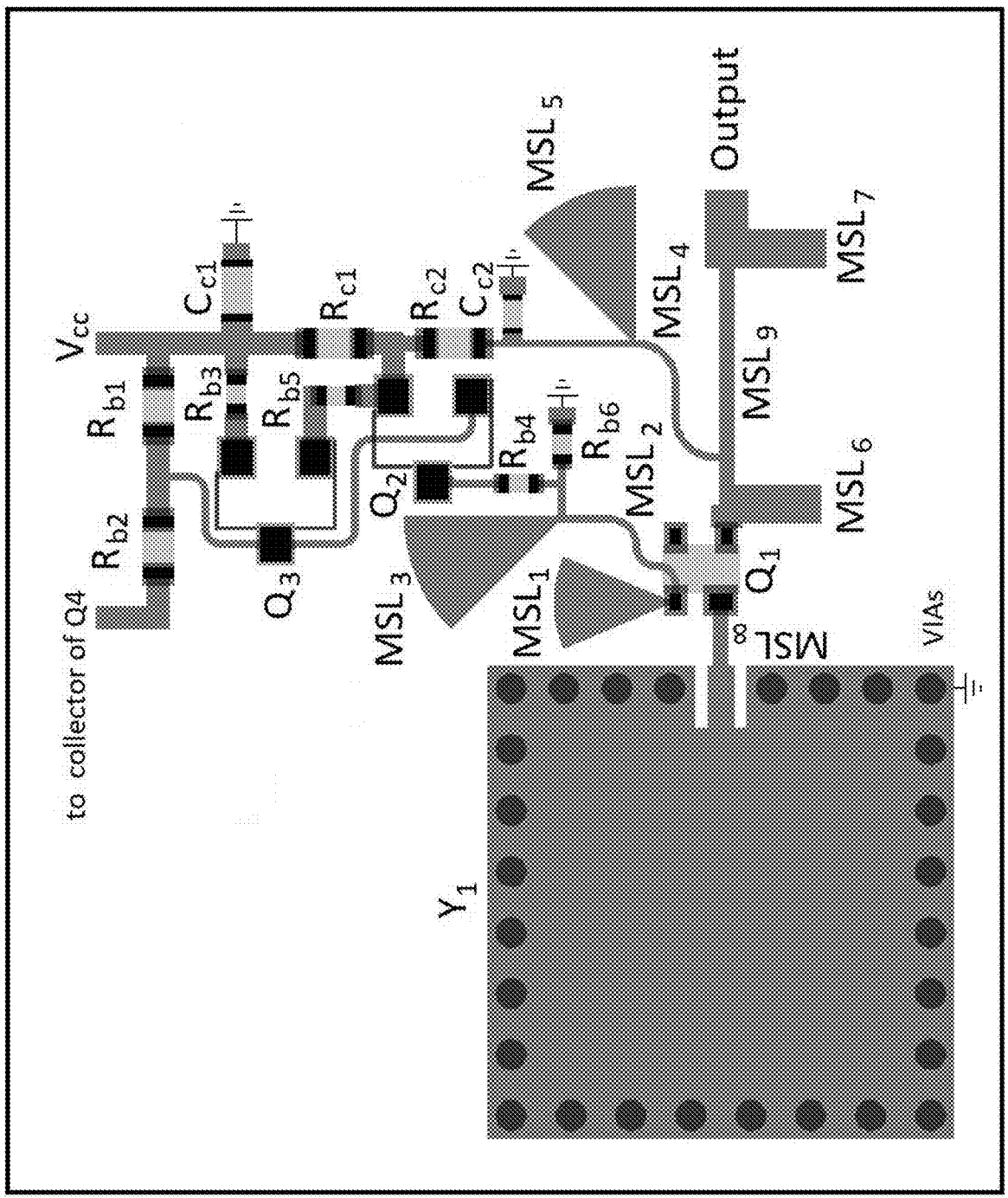
FIG. 8 is a microwave circuit layout for the oscillator circuit of FIG. 3.

FIG. 3 is a circuit diagram of an oscillator in accordance with a further embodiment of the present invention in which the bandpass filter $Y_2$ is replaced with an additional microstrip line $MSL_9$. An example of a suitable microwave circuit layout for the oscillator circuit 300 is shown in FIG. 8.

The oscillator circuit 300 of FIG. 3 is similar in structure and function to the oscillator circuits 100, 200 of FIGS. 1 and 2. As such, for ease of reference, components having a reference numeral appended starting with a '3' are alike in structure and function to those components having the same reference numeral starting with a '1' described previously with reference to FIG. 1 and/or starting with a '2' described previously with reference to FIG. 2, unless context dictates otherwise. Thus a component having reference numeral '3xx' in FIG. 3 should be assumed to be alike in form and function to the component having reference numeral '1xx' in FIG. 1 and/or reference numeral '2xx' in FIG. 2, unless otherwise specified.

As outlined above, in this particular embodiment, the bandpass filter $Y_2$ used in the oscillator circuits 100, 200 of FIGS. 1 and 2 respectively is replaced with an additional microstrip line $MSL_9$. This $MSL_9$ is dimensioned such that it possesses the desired wave impedance and electrical length and transforms the impedance at the point $MSL_7$ is connected to necessary values at the collector terminal of the oscillator transistor $Q_1$ in order to match the output impedances of the oscillator output and the collector of the oscillator transistor $Q_1$.

Figure 4:
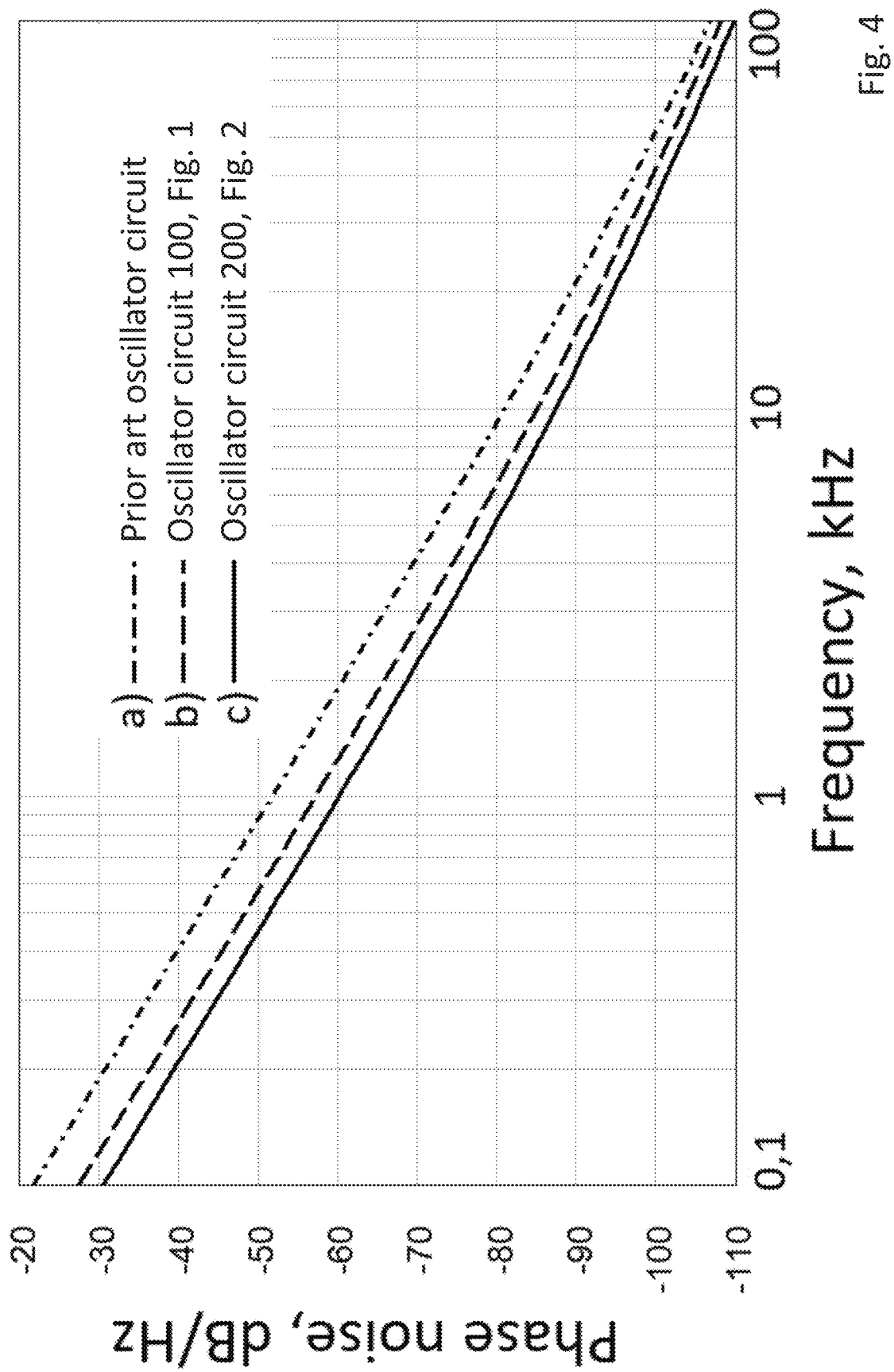
FIG. 4 is a graph showing phase noise as a function of frequency for different oscillator circuits.

FIG. 4 is a graph showing phase noise spectral density as a function of frequency for different oscillator circuits. Specifically, FIG. 4 provides a comparison of the performance of a conventional oscillator circuit with 'passive' bias control (not shown) shown as plot a), the oscillator circuit 100 with 'one-stage active bias control' of FIG. 1 shown as plot b), and the oscillator circuit 200 with 'two-stage active bias control' of FIG. 2 shown as plot c). A further comparison of the performance of these circuits can be seen in the table of FIG. 5.

As can be seen from the plots, the 'one-stage' oscillator circuit 100 of FIG. 1 provides improvements over the prior art example. Specifically, it can be seen from comparing plot a) with plot b) that around a 7 dB improvement is achieved in terms of phase noise by implementing the oscillator circuit 100 of FIG. 1. Thus, this provides for lower phase noise and faster switching than is achievable with the prior art circuit.

The 'two-stage' oscillator circuit 200 of FIG. 2 provides yet further improvements in phase noise. By comparing plot c) with plots a) and b), it can be seen that the oscillator circuit 200 of FIG. 2 provides a further 3 dB reduction in phase noise than the one-stage oscillator circuit 100 of FIG. 1, and an overall 10 dB reduction compared to the prior art passive circuit.

As can be seen from the table of FIG. 5, the oscillator circuit 100 of FIG. 1 provides improvements over the prior art passive circuit in terms of DC current drop and microwave power drop for a given drop in supply voltage $V_{cc}$, which may correspond to a drop in battery voltage over time as outlined previously.

The data shown in the table of FIG. 5 also demonstrates that the oscillator circuit 200 of FIG. 2 is even more stable over the same supply voltage drop, providing twice lower reduction of DC current and microwave output power than the prior art example.

Thus it will be appreciated that FIG. 4 demonstrates that both the oscillator circuit 100 of FIG. 1 and the oscillator circuit 200 of FIG. 2 perform better than a conventional oscillator circuit, known in the art per se. While not shown in FIGS. 5 and 6, the oscillator circuit 300 of FIG. 3 would exhibit similar performance to the circuit 200 of FIG. 2.

Figure 6:
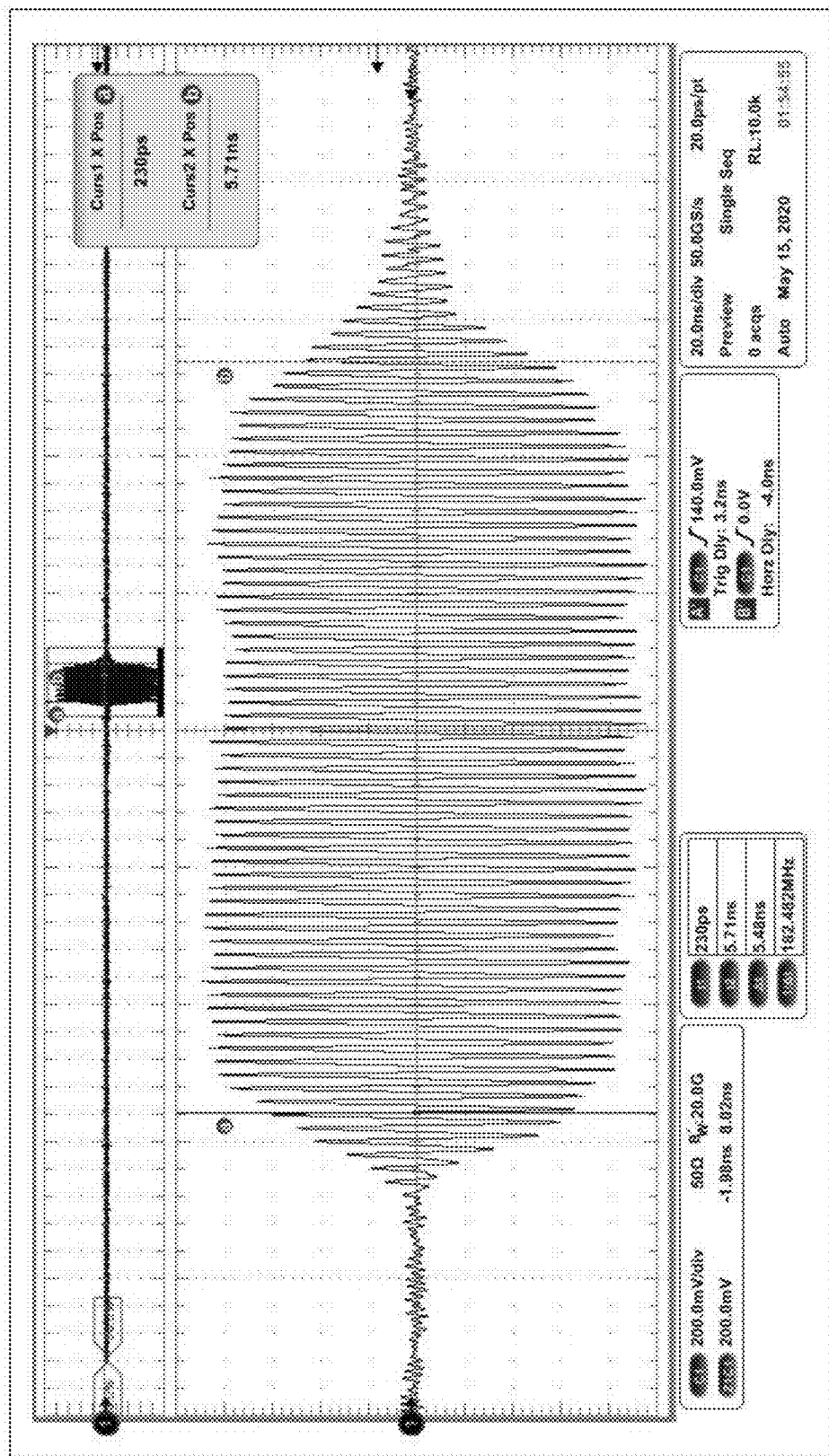
FIG. 6 is a plot showing a microwave pulse.

FIG. 6 is a plot showing a microwave pulse. In particular, FIG. 6 shows a 5.5 ns microwave pulse. A control pulse at the switch on/off input (i.e. at the base terminal of $Q_4$) of the active bias circuit 200 of FIG. 2 is 10 ns. Consequently, turn-on/off time is approximately 2.3 ns. This faster switching makes the oscillator circuits of the present invention particularly well-suited to impulse operation.

Thus it will be appreciated that aspects of the present disclosure provide an improved bias circuit for an oscillator, as well as an improved oscillator circuit comprising such a bias circuit and high quality resonator, that exhibits improvements in terms of phase noise, output power, and stability than existing 'passive' bias circuits.

While specific examples of the disclosure have been described in detail, it will be appreciated by those skilled in the art that the examples described in detail are not limiting on the scope of the disclosure.

What is claimed is:

1. An oscillator circuit comprising:
an oscillator transistor having respective first, second, and control terminals, said oscillator transistor being arranged to generate a microwave oscillating signal at the first terminal thereof;
a surface integrated waveguide resonator connected to the second terminal of the oscillator transistor; and
an active bias circuit portion comprising a negative feedback arrangement between the first terminal of the oscillator transistor and the control terminal of the oscillator transistor, the active bias circuit portion being arranged to supply a bias current to the control terminal of the oscillator transistor, wherein said bias current is dependent on a voltage at the first terminal of the oscillator transistor multiplied by a negative gain;

wherein the active bias circuit comprises a first feedback transistor having respective first, second, and control terminals, said first feedback transistor being arranged such that:
the first terminal of the first feedback transistor is connected to the first terminal of the oscillator transistor via first feedback path; and
the second terminal of the first feedback transistor is connected to the control terminal of the oscillator transistor via a second feedback path.

2. The oscillator circuit as claimed in claim 1, wherein the oscillator transistor comprises a bipolar junction transistor, wherein the first terminal of the oscillator transistor is a collector terminal, the second terminal of the oscillator transistor is an emitter terminal, and the control terminal of the oscillator transistor is a base terminal, optionally wherein the oscillator transistor comprises an npn BJT.

3. The oscillator circuit as claimed in claim 1, wherein the first feedback transistor comprises a bipolar junction transistor, wherein the first terminal of the first feedback transistor is an emitter terminal, the second terminal of the first feedback transistor is a collector terminal, and the control terminal of the first feedback transistor is a base terminal, optionally wherein the first feedback transistor comprises a pnp BJT.

4. The oscillator circuit as claimed in claim 1, wherein the first feedback path comprises first and second resistors arranged such that:
a first terminal of the first resistor is connected to a supply voltage;
a second terminal of the first resistor is connected to the first terminal of the first feedback transistor and to a first terminal of the second resistor; and
a second terminal of the second resistor is connected to the first terminal of the oscillator transistor.

5. The oscillator circuit as claimed in claim 4, wherein a first capacitor is connected between the first terminal of the first resistor and ground; and/or a second capacitor is connected between the second terminal of the second resistor and ground.

6. The oscillator circuit as claimed in claim 1, wherein the second feedback path comprises third and fourth resistors arranged such that:
a first terminal of the third resistor is connected to the second terminal of the first feedback transistor;
a second terminal of the third resistor is connected to a first terminal of the fourth resistor and to the control terminal of the oscillator transistor; and
a second terminal of the fourth resistor is connected to ground.

7. The oscillator circuit as claimed in claim 1, further comprising a switching transistor having respective first, second, and control terminals, said switching transistor being arranged such that a control signal applied to the control terminal of said switching transistor varies a current through the first and second terminals of said switching transistor, wherein the current supplied to the control terminal of the oscillator transistor is dependent on the current through the first and second terminals of said switching transistor.

8. An impulse radar motion sensor comprising the oscillator circuit as claimed in claim 1.

9. An oscillator circuit comprising:
an oscillator transistor having respective first, second, and control terminals, said oscillator transistor being arranged to generate a microwave oscillating signal at the first terminal thereof;
a surface integrated waveguide resonator connected to the second terminal of the oscillator transistor;
an active bias circuit portion comprising a negative feedback arrangement between the first terminal of the oscillator transistor and the control terminal of the oscillator transistor, the active bias circuit portion being arranged to supply a bias current to the control terminal of the oscillator transistor, wherein said bias current is dependent on a voltage at the first terminal of the oscillator transistor multiplied by a negative gain;
a second feedback transistor having respective first, second, and control terminals, said second feedback transistor being arranged such that:
the first terminal of the second feedback transistor is connected to the supply voltage via a fifth resistor;
the second terminal of the second feedback transistor is connected to the control terminal of a first feedback transistor; and
the control terminal of the second feedback transistor is connected to the first terminal of the first feedback transistor via a third feedback path;
optionally wherein the fifth resistor has a first terminal thereof connected to the first terminal of the second feedback transistor, and a second terminal thereof connected to the supply voltage and to the first terminal of the first resistor in a first feedback path.

10. The oscillator circuit as claimed in claim 9, wherein the second feedback transistor comprises a bipolar junction transistor, wherein the first terminal of the second feedback transistor is an emitter terminal, the second terminal of the second feedback transistor is a collector terminal, and the control terminal of the second feedback transistor is a base terminal, optionally wherein the second feedback transistor comprises a pnp BJT.

11. An oscillator circuit comprising:
an oscillator transistor having respective first, second, and control terminals, said oscillator transistor being arranged to generate a microwave oscillating signal at the first terminal thereof;
a surface integrated waveguide resonator connected to the second terminal of the oscillator transistor;
an active bias circuit portion comprising a negative feedback arrangement between the first terminal of the oscillator transistor and the control terminal of the oscillator transistor, the active bias circuit portion being arranged to supply a bias current to the control terminal of the oscillator transistor, wherein said bias current is dependent on a voltage at the first terminal of the oscillator transistor multiplied by a negative gain;
first, second, and third microstrip lines, arranged such that:
the first microstrip line has a first end thereof connected to the control terminal of the oscillator transistor, and a second end thereof is open-ended;
the second microstrip line has a first end thereof connected to the first end of the first microstrip line and the control terminal of the oscillator transistor; and
the third microstrip line has a first end thereof connected to a second end of the second microstrip line, and a second end thereof is open-ended;
wherein the first end of the third microstrip line and second end of the second microstrip line are connected to the active bias circuit.

12. An oscillator circuit comprising:
an oscillator transistor having respective first, second, and control terminals, said oscillator transistor being arranged to generate a microwave oscillating signal at the first terminal thereof;
a surface integrated waveguide resonator connected to the second terminal of the oscillator transistor; and
an active bias circuit portion comprising a negative feedback arrangement between the first terminal of the oscillator transistor and the control terminal of the oscillator transistor, the active bias circuit portion being arranged to supply a bias current to the control terminal of the oscillator transistor, wherein said bias current is dependent on a voltage at the first terminal of the oscillator transistor multiplied by a negative gain;
fourth and fifth microstrip lines, arranged such that:
the fourth microstrip line has a first end thereof connected to the first terminal of the oscillator transistor; and
the fifth microstrip line has a first end thereof connected to a second end of the fourth microstrip line, and a second end thereof is open-ended.

13. An oscillator circuit comprising:
an oscillator transistor having respective first, second, and control terminals, said oscillator transistor being arranged to generate a microwave oscillating signal at the first terminal thereof;
a surface integrated waveguide resonator connected to the second terminal of the oscillator transistor;
an active bias circuit portion comprising a negative feedback arrangement between the first terminal of the oscillator transistor and the control terminal of the oscillator transistor, the active bias circuit portion being arranged to supply a bias current to the control terminal of the oscillator transistor, wherein said bias current is dependent on a voltage at the first terminal of the oscillator transistor multiplied by a negative gain;
a bandpass filter connected between the first terminal of the oscillator transistor and an output terminal of the oscillator circuit;
optionally further comprising a sixth microstrip line having a first end thereof connected to an input of the bandpass filter and to the first terminal of the oscillator transistor, and a second end thereof is open ended; and/or
optionally further comprising a seventh microstrip line having a first end thereof connected to an output of the bandpass filter and to an output terminal of the oscillator circuit, and a second end thereof is open ended.

14. An oscillator circuit comprising:
an oscillator transistor having respective first, second, and control terminals, said oscillator transistor being arranged to generate a microwave oscillating signal at the first terminal thereof;
a surface integrated waveguide resonator connected to the second terminal of the oscillator transistor;
an active bias circuit portion comprising a negative feedback arrangement between the first terminal of the oscillator transistor and the control terminal of the oscillator transistor, the active bias circuit portion being arranged to supply a bias current to the control terminal of the oscillator transistor, wherein said bias current is dependent on a voltage at the first terminal of the oscillator transistor multiplied by a negative gain;
a ninth microstrip line connected between the first terminal of the oscillator transistor and an output terminal of the oscillator circuit.

* * * * *